US008692597B1

(12) United States Patent
Hiebert

(10) Patent No.: US 8,692,597 B1
(45) Date of Patent: Apr. 8, 2014

(54) PHASE-LOCKED LOOP BASED CLOCK GENERATOR AND METHOD FOR OPERATING SAME

(71) Applicant: PMC-Sierra US, Inc., Sunnyvale, CA (US)

(72) Inventor: Mark Hiebert, New Westminster (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/799,175

(22) Filed: Mar. 13, 2013

(51) Int. Cl.
*H03L 7/06* (2006.01)

(52) U.S. Cl.
USPC .......................................... 327/157; 327/148

(58) Field of Classification Search
USPC ................................................ 327/148, 157
See application file for complete search history.

(56) References Cited

U.S. PATENT DOCUMENTS

| | | | |
|---|---|---|---|
| 2004/0196939 A1* | 10/2004 | Co | 375/376 |
| 2008/0116947 A1 | 5/2008 | Lobb et al. | |
| 2010/0329388 A1 | 12/2010 | Ko | |
| 2012/0074997 A1* | 3/2012 | Kim et al. | 327/157 |
| 2012/0081339 A1* | 4/2012 | Mouri et al. | 345/204 |
| 2012/0212268 A1* | 8/2012 | Kim | 327/158 |
| 2012/0262209 A1* | 10/2012 | Peng et al. | 327/158 |
| 2012/0306553 A1* | 12/2012 | Kim et al. | 327/158 |
| 2013/0162309 A1* | 6/2013 | Tamura | 327/156 |

* cited by examiner

*Primary Examiner* — Adam Houston
(74) *Attorney, Agent, or Firm* — Dennis R. Haszko

(57) ABSTRACT

An integer-N phase-locked loop based clock generator for generating an output clock signal with a frequency N multiples of a reference clock signal, and a method for same, wherein N is a positive integer. The integer-N clock phase-locked loop based generator comprises a reference clock, a voltage controlled oscillator, a clock divider, a first and second phase generator for generating a plurality of phases of the reference clock signal and divided down output clock signal, a plurality of phase frequency detectors and charge pumps. The method comprises generating a reference clock and an output clock signals, generating a plurality of phases of a divided down output clock signal and reference clock signal, comparing the plurality of phases, and changing the frequency of the output clock signal based on the comparison.

20 Claims, 3 Drawing Sheets

PHASE-LOCKED LOOP BASED CLOCK GENERATOR AND METHOD FOR OPERATING SAME

FIELD

The present disclosure relates generally to clock signal generation, for example in wireless applications. More particularly, the present disclosure relates to an integer-N phase-locked loop based clock generator and a method for operating same.

BACKGROUND

Wireless infrastructure applications require high frequency, low phase noise, clock signals to drive various components in wireless transceivers such as, for example, Digital-Analog-Converters (DACs), Analog-Digital-Converters (ADCs), and other clock generators such as Local Oscillator (LO) generators.

To obtain a high frequency output clock signal to drive various components, typically a low frequency reference clock signal is multiplied up to the high frequency by using an integer-N phase-locked loop (PLL), where N is the amount by which the reference clock signal is multiplied.

FIG. 1 shows a conventional integer-N PLL-based clock generator 102. The clock generator 102 includes a reference clock 104 which generates a reference clock signal $F_{REF}$, a phase frequency detector (PFD) 106, a charge pump (CP) 108, a loop filter (LF) 110, a voltage controlled oscillator (VCO) 112 which generates an output clock signal $F_{OUT}$, and a frequency divider (DIV-N) 114. The frequency divider 114 outputs the comparison clock signal $F_{DIV}$, which is the $F_{OUT}$ signal divided by N (the amount by which the reference clock signal $F_{REF}$ is to be multiplied). The reference clock signal $F_{REF}$ and the comparison signal $F_{DIV}$ are both input into the PFD 106. For each clock cycle of the reference clock signal $F_{REF}$, if the PFD 106 detects a phase difference and/or a frequency difference between $F_{REF}$ and $F_{DIV}$, the PFD sends a pulse signal PS to the CP 108. Upon receipt of the pulse signal PS, the CP 108 generates a corresponding control current $I_C$. The LF 110 converts the control current $I_C$ to a control voltage $V_C$. The control voltage $V_C$ controls the frequency of the output clock signal $F_{OUT}$ generated by the VCO 112. The output clock signal $F_{OUT}$ from the VCO is proportional to the control voltage $V_C$. The output clock signal $F_{OUT}$ is used by various other components in wireless transceivers as their input clock.

As noted above, the output clock signal $F_{OUT}$ is divided down by the frequency divider 116 by a factor of N to generate the comparison clock signal $F_{DIV}$. The comparison clock signal $F_{DIV}$ is compared to the reference clock signal $F_{REF}$ in the PFD 106 to, ultimately, control the VCO 112. With a negative feedback loop as described above, the PLL-based frequency synthesizer multiplies the reference clock signal $F_{REF}$ by N amount, wherein N is an integer, while locking output clock signal $F_{OUT}$ from the VCO 112 to the phase and frequency of the reference clock signal $F_{REF}$.

When a reference clock signal is multiplied up to a higher frequency using a conventional integer-N PLL-based clock generator 102 as shown in FIG. 1, spurious content is generated in the high frequency output clock signal. The spurious content comes from leakage of the reference clock signal and its harmonics into the output clock signal. Specifically, the spurious content is caused by the phase frequency detector 106 and charge pump 108. Phase frequency detectors and charge pumps need to be large and of high voltage to control the high voltage VCOs which produce the high quality output clock signals. These large, high voltage, phase frequency detectors and charge pumps, however, cause significant power supply transients in the surrounding circuitry and introduce disturbances during each phase detection and charge pump event (i.e. each clock cycle of the reference clock signal). Both the charging activity and the parasitic coupling between charge pump circuitry and output path circuitry (e.g. shared ground) generate unwanted spurious content on the higher frequency output clock signals. The result is that a spike of spurious content is generated in the output clock signal once in every N of its cycles—the spike corresponding in time to, and caused by the circuit activity triggered by, the clock edge of the reference clock signal.

To limit the deleterious effect of spurious content in wireless transceiver components which use the output clock signal, reference clocks above 100 MHz are currently used. This results in spurious content at least 100 MHz away from the output clock signal. This is preferred since it does not negatively affect the components in wireless transceivers to the same extent as does spurious content less than 100 MHz away. Next generation systems are using 300 MHz and even 600 MHz reference clock signals to further distance the spurious content from the output clock signal (push the spurious content out of band). A drawback to using high frequency reference clocks, however, is the cost. Reference clocks below 30-40 MHz are generally quite cost optimized. Another drawback is that the phase frequency detectors and charge pumps must be faster to accommodate the high frequency reference clock signals.

BRIEF DESCRIPTION OF THE DRAWINGS

Embodiments of the present disclosure will now be described, by way of example only, with reference to the figures.

DETAILED DESCRIPTION

Figure 1:
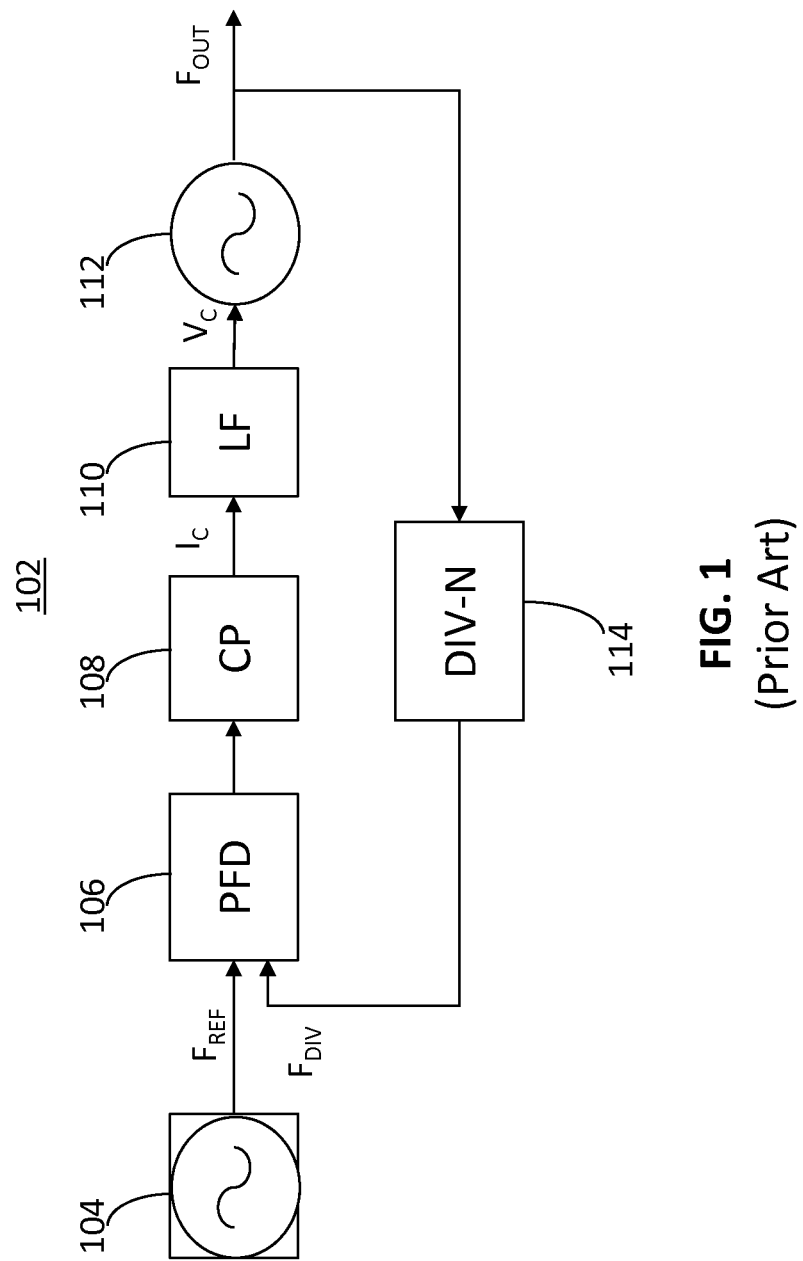
FIG. 1 shows an integer-N PLL-based clock generator as known in the art.

This specification describes an integer-N phase-locked loop clock generator, where N is a positive integer, and a method for operating same. The integer-N phase-locked loop clock generator comprises a reference clock, a first phase generator for generating a plurality of phases of a signal from the reference clock, a voltage controlled oscillator, a clock divider for dividing down a signal from the voltage controlled oscillator, a second phase generator for generating a plurality of phases of the divided down voltage controlled oscillator signal, a plurality of phase frequency detectors for comparing a plurality of phase pairs and generating a pulse signal, each pair comprising one of the plurality of phases of the first phase generator and one of the plurality of phases of the second phase generator, and a plurality of charge pumps for controlling the voltage controlled oscillator based on the pulse signal. In an example embodiment, the phase frequency detectors generate the pulse signal when either or both of the phase and the frequency of any of the phase pairs are not the same. In another example embodiment, the clock divider divides the signal from the voltage controlled oscillator by N. In another example embodiment, the first phase generator generates N phases of the signal from the reference clock, and the second phase generator generates N phases of the divided down signal from the voltage controlled oscillator. In another example embodiment, the integer-N phase-locked loop clock generator comprises at least N phase frequency detectors. In another example embodiment, the integer-N phase-locked loop clock generator comprises at least N charge pumps. In another example embodiment, the integer-N phase-locked loop clock generator comprises a mapper for mapping the plurality phase pairs to the plurality of phase frequency detectors. In another example embodiment, the mapper maps at least one of the plurality of phase pairs to two or more of the phase frequency detectors. In another example embodiment, the mapper maps phase pair X to phase frequency detector D, according to the following: D=X+N*(0 to DIV(M,N)−1), wherein M is the total number of phase frequency detectors; N is the total number of phase pairs of the first phase generator and the second phase generator; X is a positive integer number between 1 and N, each number corresponding to only one of the plurality of phase pairs of the first phase generator and the second phase generator; DIV(M,N) is equal to the quotient of M divided by N, namely, the number of times N divides completely into M; and D is a positive integer number between 1 and M, each number corresponding to only one of the phase frequency detectors.

The method comprises generating a reference clock signal, generating an output clock signal, dividing down the output clock signal, generating a plurality of phases of the divided down output clock signal and a plurality of phases of the reference clock signal, generating a pulse signal based on a comparison of the phase and frequency of a plurality of phase pairs, each pair comprising one of the plurality of phases of the divided down output clock signal and one of the plurality of phases of the reference clock signal, and changing the frequency of the output clock signal according to the pulse signal. In an example embodiment, generating the pulse signal, based on the comparison of the phase and frequency of the plurality of phase pairs, comprises generating the pulse signal when either or both of the phase and the frequency of the plurality of phases of the reference clock signal and the plurality of phases of the divided down output clock signal are not the same. In another example embodiment, dividing down the output clock signal comprises dividing down the output clock signal by a factor of N. In another example embodiment, generating the plurality of phases of the divided down output clock signal comprises generating N phases of the divided down output clock signal; and generating a plurality of phases of the reference clock signal comprises generating N phases of the reference clock signal. In another example embodiment, the comparison of the phase and frequency of the phase pairs comprises comparing each phase pair in at least one different phase frequency detector. In another example embodiment each phase pair is mapped to one or more phase frequency detectors. In another example embodiment, mapping each phase pair to one or more phase frequency detectors comprises mapping at least one phase pair to two or more of the phase frequency detectors. In another example embodiment, mapping each phase pair to one or more phase frequency detectors comprises mapping phase pair X of the first phase generator and the second phase generator to phase frequency detector D, according to the following: D=X+N*(0 to DIV(M,N)−1), wherein M is the total number of phase frequency detectors; N is the total number of phase pairs of the first phase generator and the second phase generator; X is a positive integer number between 1 and N, each number corresponding to only one of the plurality of phase pairs of the first phase generator and the second phase generator; DIV(M,N) is equal to the quotient of M divided by N, namely, the number of times N divides completely into M; and D is a positive integer number between 1 and M, each number corresponding to only one of the phase frequency detectors.

Other aspects and features of the present disclosure will become apparent to those ordinarily skilled in the art upon review of the following description of specific embodiments in conjunction with the accompanying figures.

Figure 2A:
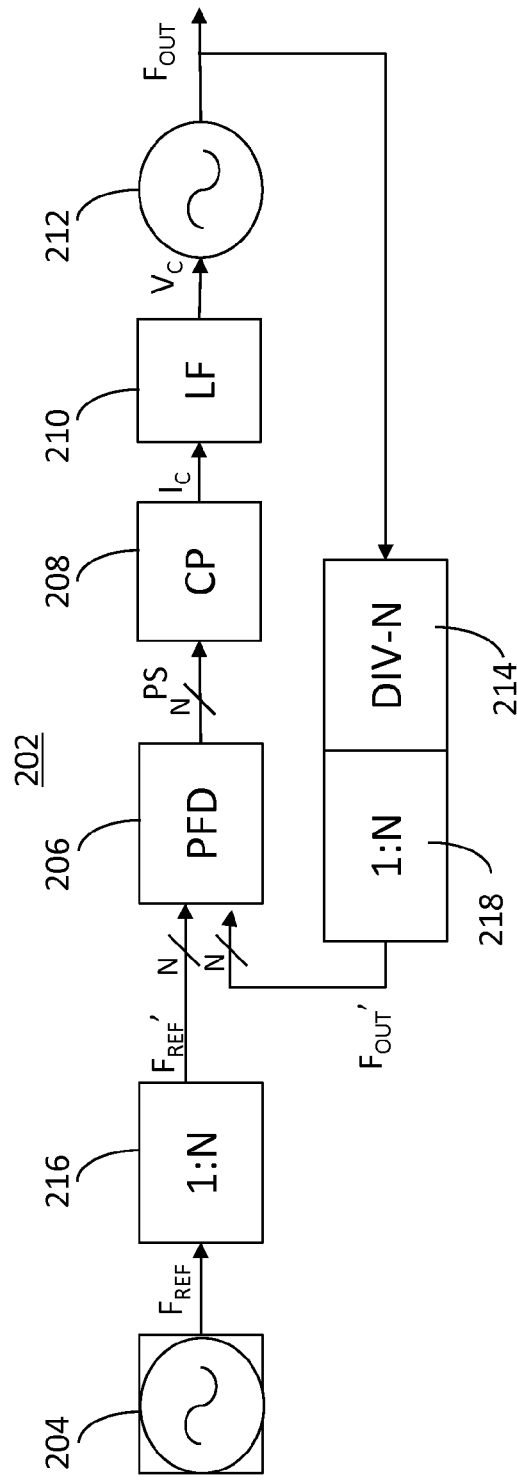
FIG. 2A shows an integer-N PLL-based clock generator in accordance with an embodiment of the present disclosure.

FIG. 2A shows an integer-N PLL-based output clock generator 202 according to an embodiment of the present disclosure. The output clock generator 202 comprises a reference clock 204, a plurality N of phase frequency detectors 206, a plurality N of charge pumps 208, a loop filter 210, a voltage controlled oscillator (VCO) 212, and a clock divider 214. The output clock generator 202 also comprises a first phase generator 216 and a second phase generator 218.

The reference clock 204 generates a reference clock signal FREF which is input into the first phase generator 216. The first phase generator 216 creates a plurality N of different phase clock signals FREF' of the reference clock signal FREF as described and illustrated in further detail later in relation to FIG. 2B. The degree by which each of the plurality of phases of the reference clock signal FREF' is offset from the other phases, may be the same. Phase pairs, each pair comprising one of the plurality of phases of the reference clock signal FREF' and one of the plurality of phases of the divided down output clock signal $F_{OUT}'$, are input into the plurality of phase frequency detectors 206 coupled to the plurality of charge pumps 208.

In the embodiment of FIG. 2A, the first phase generator 216, the second phase generator 218, the plurality of phase frequency detectors 206, and the plurality of charge pumps 208 are all interleaved such that each one of the phase frequency detectors 206 compares at most one of the plurality of phases of the reference clock signal FREF' and the corresponding phase of the plurality of phases of the output clock signal $F_{OUT}'$ for phase alignment and frequency. If any of the plurality of phase frequency detectors 206 detect that the two signals of its phase pair are not aligned and/or do not have the same frequency, then the phase frequency detector 206 sends a pulse signal PS to its corresponding charge pump 208. Each of the plurality of phase frequency detectors 206, is coupled to a corresponding one of the plurality of charge pumps 208. The plurality of charge pumps 208 cumulatively controls the operation of the VCO 212 through a control current IC which is converted by the loop filter 210 into a control voltage VC. The pulse signals PS comprise either an UP or DOWN signal. The PS is an UP signal if any phase of the $F_{OUT}'$ signal is slower than the corresponding phase of the reference clock signal FREF'. Conversely, the PS is a DOWN signal if any phase of the $F_{OUT}'$ signal is faster than the corresponding phase of the reference clock signal FREF'.

Each of the plurality of charge pumps 208, operates independently of the other charge pumps 208. Each charge pump 208 outputs a control current IC to the loop filter 210. The control current IC is either positive if the charge pump 208 receives an UP signal, or negative if the charge pump 208 receives a DOWN signal. In an example embodiment, the loop filter 210 is a type of low pass filter comprising one or more capacitors connected in parallel to each other and connected to ground through a resistor. Positive control current IC increases the voltage across the one or more capacitors (control voltage VC) and negative control current IC decreases the control voltage VC. Although each charge pump 208 operates independently of the other charge pumps, their control voltages VC, have a cumulative effect on the loop filter 210.

The control voltage VC determines the signal frequency generated by the VCO 212. A higher control voltage VC increases the frequency of the VCO 212 and therefore increases the frequency of the output clock signal $F_{OUT}$, and a lower control voltage VC decreases the frequency of the VCO 212 and therefore decreases the frequency of the output clock signal $F_{OUT}$.

The output clock signal $F_{OUT}$ is input into a frequency divider 214, and then into the second phase generator 218 to generate the N phases of the output clock signal $F_{OUT}'$. The second phase generator 218 is substantially the same as the first phase generator 206 and the phase generator shown in FIG. 2B. The frequency divider 214 and second phase generator 216 are provided since the single, high frequency, output clock signal $F_{OUT}$ needs to be divided into N phases so that each phase can be compared with the corresponding phase of the reference clock signal $F_{REF}'$.

Ideally, the phases produced by the first phase generator 216 are adjacently spaced from one another by exactly the same period as the phases in the output clock signal $F_{OUT}'$ of the second phase generator 218. Small imperfections in the circuitry of phase generators, however, can introduce small errors in spacing. These small errors can cause the phase frequency detector 206 and the charge pump 208 to activate unnecessarily. To mitigate the spacing errors, in an embodiment, identical phase generators are used for the first phase generator 216 and the second phase generator 218. This way, the identical errors in spacing are introduced causing the same mismatch in phase and reducing unnecessary activation of the phase frequency detector 206 and charge pump 208.

Conventional integer-N PLL-based clock generators as shown in FIG. 1, create spurious content in the output clock signal $F_{OUT}$. This spurious content is from the leakage of the reference clock signal FREF and its harmonics. The spurious content occurs every N cycles of the output clock signal $F_{OUT}$. It is predominantly caused by the activities of the phase frequency detector 106 and the charge pump 108 upon a phase detection event. When the pair of signals are not aligned, greater spurious content is produced in the output clock signal $F_{OUT}$ than that which is produced when the signals are aligned. Parasitic coupling (i.e. a shared ground) between the circuitry of the charge pump 108 and the output clock signal FOUT results in spurious content being generated by the charge pump 108 at a phase detection event. In the output clock signal $F_{OUT}$, the frequency of the 2 nearest spurious tones (the reference clock signal FREF harmonics) can be calculated with some precision using the two formulas (N−1)*FREF, and (N+1)*FREF, where N is the amount by which the reference clock signal FREF is multiplied.

Rather than have the phase frequency detector 206 and the charge pump 208 potentially activate once every N cycles of the output clock signal $F_{OUT}$, in an embodiment of the present disclosure as shown in FIG. 2A, one of the plurality of phase frequency detectors 206 and the corresponding one of the plurality of charge pumps 208 potentially activate once every cycle of the output clock signal $F_{OUT}$. Although each individual phase frequency detector 206 and charge pump 208 pair potentially operate only once in every N cycles of the output clock signal $F_{OUT}$, there are N phase frequency detectors 206, N charge pumps 208, and N phases of the reference clock signal FREF. In effect, the work of detecting phase and frequency alignment at a high frequency, is being shared or spread. When viewed collectively as a whole, the phase frequency detectors 206, charge pumps 208, and the plurality of phases of the reference clock signal FREF' appear to be operating at the frequency of the output clock signal $F_{OUT}$. This arrangement reduces, or reduces the effect of, spurious content in the output clock signal $F_{OUT}$ in two ways.

First, because there is a plurality of charge pumps 208 and the control current from the plurality of charge pumps 208 has a cumulative effect on the loop filter 210, each charge pump 208 can reduce the amount of control current IC it individually outputs at any one time. Rather than one large spike of current (and a corresponding large spike of spurious content) potentially every N cycles of the output clock signal $F_{OUT}$, a small spike of current (and a corresponding small spike of spurious content) is generated potentially every cycle of the output clock signal $F_{OUT}$. Where a single charge pump is replaced with a plurality N of charge pumps 208, each of the plurality of charge pumps 208 will only need to output 1/Nth of the current of the single charge pump. Even though some spurious content occurs in the output clock signal $F_{OUT}$, the spurious content is small and the spurious content is uniform for each output clock signal $F_{OUT}$ cycle. Generally, the various components, such as components in wireless transceivers, that use the output clock are better able to handle small, uniform, spurious content.

Second, even if spurious content is generated in the output clock signal $F_{OUT}$, the spurious content occurs at the same frequency and at the same time as the output clock signal $F_{OUT}$. In other words, the periodic, corrective, interruptions of the phase frequency detector and charge pump occur at the same frequency as the output clock signal $F_{OUT}$. When spurious content occurs on a clock edge, the components using that clock edge are not as affected.

A drawback of using higher frequency reference clocks is also avoided according to an embodiment of the present disclosure. The phase frequency detectors 206 and charge pumps 208 do not need to be able to accommodate a high frequency (e.g. greater than 100 MHz) clock since each phase frequency detector 206 and charge pump 208 combination only ever experience one of the N phases of the low frequency of the reference clock signal FREF.

Figure 2B:
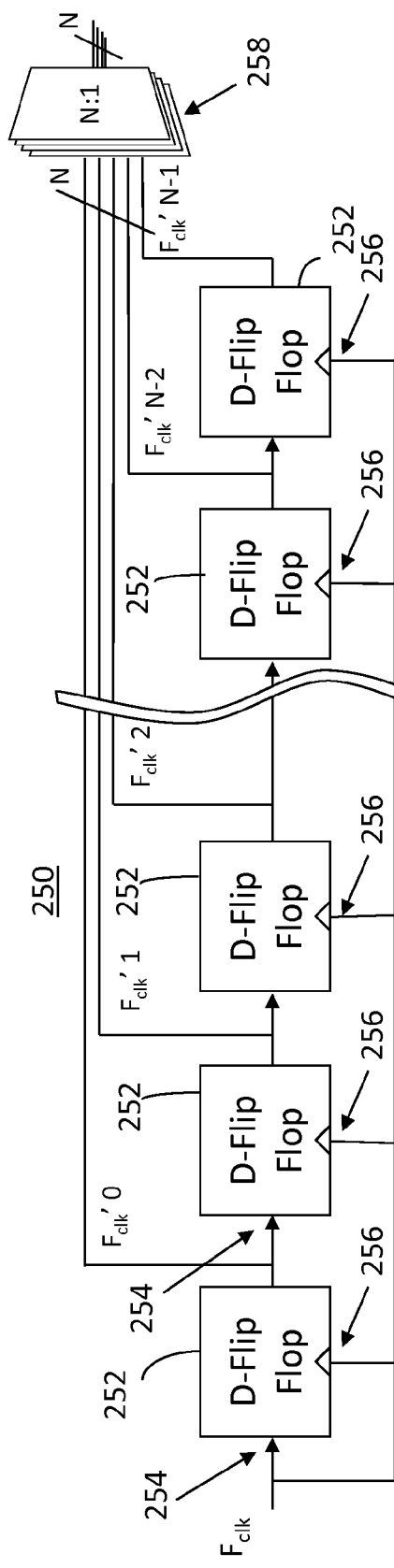
FIG. 2B shows an embodiment of a conventional phase generator.

FIG. 2B shows a conventional phase generator 250 for generating a flexible plurality of clock signal phases Fclk' from a clock signal Fclk, the plurality of clock signals phases Fclk' having the same frequency as the clock signal, and different phases from each other. The phase generator 250 comprises a series of N delay elements 252 such as D-flip flops, where N is the maximum number of clock signal phases Fclk' which could generated. The D-flip flops 252 are arranged in a cascade arrangement, and each D-flip flop 252 has a data input 254, a clock input 256, and a data output Fclk' 0 to N−1. The clock signal Fclk is input into the data input 254 to the first D-flip flop 252. The data input 254 to each subsequent D-flip flop 252 receives the output Fclk' X from the preceding D-flip flop 252, where X is the number of D-flip flops 252 preceding to D-flip flop 252 in question. The clock signal Fclk is input into the clock input 258 of each D-flip flops 252. As the clock signal Fclk propagates across each of the D-flip flops 252 through the data path, a new phase of the clock signal phase Fclk' is generated at the D-flip flop 252 output. The plurality N D-flip flops 252 are each connected to a plurality N multiplexors 258. Each multiplexor 258 has N inputs to accommodate the N D-flip flop 252 outputs. Controlling which inputs to the multiplexors 258 are output, allows the phase generator 250 to generate a flexible number of phases up to a maximum of N phases.

In an embodiment of the present disclosure as shown in FIG. 2A, the amount by which the reference clock signal FREF is multiplied (N), is flexible. N can be configured prior to, and during, operation of the output clock generator 202. In an embodiment, the frequency divider 214, the first phase generator 216, the number of phase frequency detectors 206, and the number of charge pumps 208 are chosen based on the highest N multiplier desired for the output clock generator 202. To vary the multiplier (N) from the maximum for which the output clock generator 202 is designed, the frequency divider 214 is adjusted to reduce the amount N by which it divides the output clock signal $F_{OUT}$. Some of the delay elements 252, as described and illustrated in relation to FIG. 2B, in the first phase generator 216 and the second phase generator 218 are also disabled. Programmable frequency dividers are common general knowledge to persons skilled in the art.

The number of delay elements 252 that are left enabled corresponds to the multiplier (N). Whereas the disabled delay elements are each no longer generating a phase of the reference clock signal FREF, certain of the phase frequency detectors 206 and charge pumps 208 do not receive the corresponding phases and are, accordingly, unused. These unused charge pumps 208 do not send a control current IC to the loop filter 210. Since the same net control current IC is required by the loop filter 210 to control the VOC 212, irrespective of N, each individual charge pump 208 is configured to, alone, provide sufficient control current IC for the loop filter 210 to operate and control the VCO 212. In embodiments in which the maximum multiplier (N) is very large, it may not always be practical to have each charge pump configured in this fashion.

Figure 3:
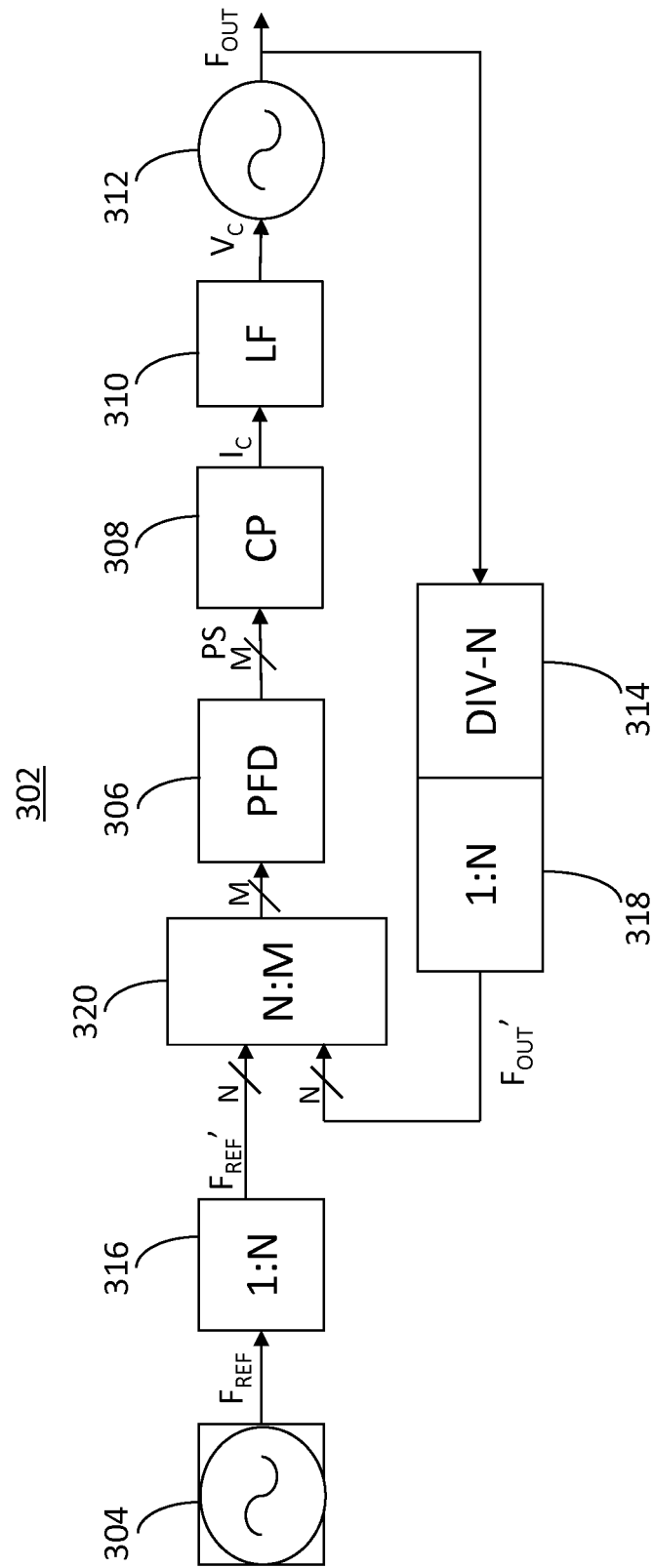
FIG. 3 shows an output clock generator 302 in accordance with an alternate embodiment of the present disclosure.

FIG. 3 shows an output clock generator 302 in accordance with another embodiment of the present disclosure. The output clock generator 302 is substantially the same as shown in FIG. 2A, the difference being that the output clock generator 302 comprises a plurality M of phase frequency detectors 306 and a plurality M of charge pumps 308 interleaved therewith, where M is greater than the number of clock phase signals N. The output clock generator 302 also further comprises a mapper 320 which maps the plurality of N phases of the reference clock signal $F_{REF}'$ and the plurality of N phases of the output clock signal $F_{OUT}'$ to the plurality M of phase frequency detectors 306 and plurality M of charge pumps 308 such that a maximum number of phase frequency detectors 306 and charge pumps 308 receive one or more of the N phases of the reference clock signal $F_{REF}'$.

In an example embodiment, the mapper 320 comprises substituting the plurality N of multiplexors 258 of phase generator 250 as show in FIG. 2B, with a plurality M of multiplexors. Each of the plurality M of multiplexors is connected to one of the plurality M phase frequency detectors 306. The plurality M of multiplexors 258 is controlled by a controller. The controller is configured to map each phase pair X of the N plurality of phases of the reference clock signal $F_{REF}'$ and the output clock signal $F_{OUT}'$, to phase frequency detector D of the plurality M phase frequency detectors 306 according to the following equation:

$$D = X + N*(0 \text{ to } DIV(M,N)-1),$$

wherein

M is the total number of phase frequency detectors;

N is the total number of phase pairs of the first phase generator and the second phase generator;

DIV(M,N) is equal to the quotient of M divided by N, namely, the number of times N divides completely into M;

X is a positive integer number between 1 and N, each number corresponding to only one of the plurality of phase pairs of the first phase generator and the second phase generator.

D is a positive integer number between 1 and M, each number corresponding to only one of the phase frequency detectors; and In the preceding description, for purposes of explanation, numerous details are set forth in order to provide a thorough understanding of the embodiments. However, it will be apparent to one skilled in the art that these specific details are not required. In other instances, well-known electronic structures and circuits are shown in block diagram form in order to not obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. An integer-N phase-locked loop clock generator, where N is a positive integer, comprising:
   a reference clock;
   a first phase generator for generating N first phase signals from a signal from the reference clock;
   a voltage controlled oscillator;
   a clock divider for dividing down a signal from the voltage controlled oscillator;
   a second phase generator for generating N second phase signals from the divided down voltage controlled oscillator signal;
   a mapper configured to receive N phase pairs and output the N phase pairs as M phase pairs, where M is a positive integer greater than N, each of the N phase pairs comprising a respective one of the N first phase signals generated by the first phase generator and a respective one of the N second phase signals generated by the second phase generator;
   M phase frequency detectors, each phase frequency detector configured to receive a respective one of the M phase pairs, and to generate a pulse signal based on a comparison of the first phase signal with the second phase signal of the respective received phase pair;
   M charge pumps, each charge pump configured to receive the pulse signal generated by a respective one of the M phase frequency detectors and to generate a control current based on the received pulse signal; and
   a loop filter for receiving the control current from each of the M charge pumps and for controlling the voltage controlled oscillator based on the received control currents.

2. The integer-N phase-locked loop clock generator of claim 1, wherein each of the M phase frequency detectors is configured to compare a phase of the first phase signal with a phase of the second phase signal of the respective received phase pair and to generate the pulse signal when the phase of the first phase signal is unaligned with the phase of the second phase signal.

3. The integer-N phase-locked loop clock generator of claim 1, wherein the clock divider divides the signal from the voltage controlled oscillator by N.

4. The integer-N phase-locked loop clock generator of claim 1, wherein each of the M phase frequency detectors is configured to compare a frequency of the first phase signal with a frequency of the second phase signal of the respective received phase pair and to generate the pulse signal when the frequency of the first phase signal is different than the frequency of the second phase signal.

5. The integer-N phase-locked loop clock generator of claim 4, wherein each of the M phase frequency detectors is configured to compare a phase of the first phase signal with a phase of the second phase signal of the respective received phase pair, to compare a frequency of the first phase signal with a frequency of the second phase signal of the respective received phase pair, and to generate the pulse signal when both the phase of the first phase signal is unaligned with the phase of the second phase signal and the frequency of the first phase signal is different than the frequency of the second phase signal.

6. The integer-N phase-locked loop clock generator of claim 1, wherein the first phase generator is the identical to the second phase generator, to introduce identical errors in spacing a phase of the first N phase signals and the second N phase signals, and to reduce unnecessary activation of the M phase frequency detectors and the M charge pumps.

7. The integer-N phase-locked loop clock generator of claim 1, wherein the mapper outputs at least one of the N phase pairs to two or more of the M phase frequency detectors.

8. The integer-N phase-locked loop clock generator of claim 1, wherein the mapper maps phase pair X of N to phase frequency detector D of M, according to the following:

$$D = X + N*(0 \text{ to } \mathrm{DIV}(M,N)-1), \text{ wherein}$$

X is a positive integer number between 1 and N, each X corresponding to only one of the N phase pairs;
DIV(M,N) is equal to the quotient of M divided by N, namely, the number of times N divides completely into M; and
D is a positive integer number between 1 and M, each D corresponding to only one of the phase frequency detectors.

9. A method of controlling a frequency of an output clock signal, comprising
generating a reference clock signal;
generating N first phase signals from the reference clock signal;
dividing down the output clock signal;
generating N second phase signals from the divided down output clock signal;
mapping N phase pairs to M phase pairs, where M is a positive integer greater than N, each N phase pair comprising a respective one of the N first phase signals and a respective one of the N second phase signals;
generating M pulse signals, each of the M pulse signals being generated based on a comparison of the first phase signal with the second phase signal of a respective one of the M phase pairs;
generating M control currents based on the M pulse signals; and
changing the frequency of the output clock signal based on the M control currents.

10. The method of claim 9, wherein each of the M pulse signals is generated when a phase of the first phase signal is unaligned with a phase of the second phase signal.

11. The method of claim 9, wherein dividing down the output clock signal comprises dividing down-the output clock signal by a factor of N.

12. The method of claim 9, wherein each of the M pulse signals is generated when a frequency of the first phase signal is different than a frequency of the second phase signal.

13. The method of claim 9, wherein, each of the M pulse signals is generated when both a phase of the first phase signal is unaligned with a phase of the second phase signal and when frequency of the first phase signal is different than a frequency of the second phase signal.

14. The method of claim 9, wherein mapping N phase pairs to M phase pairs comprises mapping at least one of the N phase pairs to two or more of the M phase pairs.

15. The method of claim 9, wherein mapping N phase pairs to M phase pairs comprises mapping phase pair X to phase pair D, according to the following:

$$D = X + N*(0 \text{ to } \mathrm{DIV}(M,N)-1), \text{ wherein}$$

X is a positive integer number between 1 and N, each X corresponding to only one of the N phase pairs;
DIV(M,N) is equal to the quotient of M divided by N, namely, the number of times N divides completely into M; and
D is a positive integer number between 1 and M, each D corresponding to only one of the phase frequency detectors.

16. An integer-N phase-locked loop clock generator, where N is a positive integer, comprising:
a reference clock;
a first phase generator for generating a plurality of phases of a signal from the reference clock;
a voltage controlled oscillator;
a clock divider for dividing down a signal from the voltage controlled oscillator;
a second phase generator for generating a plurality of phases of the divided down voltage controlled oscillator signal;
a plurality of phase frequency detectors for comparing a plurality of phase pairs and generating a pulse signal, each pair comprising one of the plurality of phases of the first phase generator and one of the plurality of phases of the second phase generator; and
a plurality of charge pumps for controlling the voltage controlled oscillator based on the pulse signal;
a mapper for mapping the plurality phase pairs to the plurality of phase frequency detectors;
wherein the mapper maps phase pair X to phase frequency detector D, according to the following:

$$D = X + N*(0 \text{ to } \mathrm{DIV}(M,N)-1), \text{ wherein}$$

M is the total number of phase frequency detectors;
N is the total number of phase pairs of the first phase generator and the second phase generator;
X is a positive integer number between 1 and N, each X corresponding to only one of the plurality of phase pairs of the first phase generator and the second phase generator;
DIV(M,N) is equal to the quotient of M divided by N, namely, the number of times N divides completely into M; and
D is a positive integer number between 1 and M, each D corresponding to only one of the phase frequency detectors.

17. The integer-N phase-locked loop clock generator of claim 16, wherein the phase frequency detectors generate the pulse signal when either or both of the phase and the frequency of any of the phase pairs are not the same.

18. The integer-N phase-locked loop clock generator of claim 16, wherein the clock divider divides the signal from the voltage controlled oscillator by N.

19. The integer-N phase-locked loop clock generator of claim 16, wherein the mapper maps at least one of the plurality of phase pairs to two or more of the phase frequency detectors.

20. The integer-N phase-locked loop clock generator of claim 18, wherein the first phase generator generates N phases of the signal from the reference clock, and the second phase generator generates N phases of the divided down signal from the voltage controlled oscillator, and wherein the integer-N phase-locked loop clock generator further comprises at least N phase frequency detectors and at least N charge pumps.

* * * * *